(12) United States Patent
Chen et al.

(10) Patent No.: US 6,444,404 B1
(45) Date of Patent: Sep. 3, 2002

(54) METHOD OF FABRICATING ESD PROTECTION DEVICE BY USING THE SAME PHOTOLITHOGRAPHIC MASK FOR BOTH THE ESD IMPLANTATION AND THE SILICIDE BLOCKING REGIONS

(75) Inventors: Tung-Yang Chen; Ming-Dou Ker; Hun-Hsien Chang, all of Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/635,585

(22) Filed: Aug. 9, 2000

(51) Int. Cl.⁷ ................................................ G03C 5/00
(52) U.S. Cl. ...................... 430/314; 430/312; 430/313; 430/316; 430/317
(58) Field of Search ................................. 430/312, 313, 430/314, 316, 317; 438/624, 625, 650, 660, 682, 597, 399, 301, 303, 304, 305, 306, 307

(56) References Cited

U.S. PATENT DOCUMENTS

| 5,262,344 A | 11/1993 | Mistry | 437/57 |
|---|---|---|---|
| 5,416,036 A | 5/1995 | Hsue | 437/51 |
| 5,455,444 A | 10/1995 | Hsue | 257/413 |
| 5,493,142 A | 2/1996 | Randazzo et al. | 257/328 |
| 5,496,751 A | 3/1996 | Wei et al. | 437/41 |
| 5,585,299 A | 12/1996 | Hsu | 437/56 |
| 5,672,527 A | 9/1997 | Lee | 437/41 RLD |
| 5,733,794 A | 3/1998 | Gilbert et al. | 437/45 |
| 6,169,020 B1 * | 1/2001 | Kim et al. | 438/597 |

* cited by examiner

Primary Examiner—Mark F. Huff
Assistant Examiner—Saleha R. Mohamedulla
(74) Attorney, Agent, or Firm—George O. Saile; Stephen B. Ackerman

(57) ABSTRACT

A process for forming an implanted ESD region, and for forming metal silicide blocking regions, using the same photolithographic mask for definition of these regions, has been developed. The process features the formation of an implanted ESD region, defined by a photoresist shape which in turn had been formed via exposure of a negative photoresist layer, using a specific photolithographic mask. Metal silicide regions are subsequently formed on regions of a semiconductor substrate, exposed in openings in an insulator layer, with the openings in the insulator layer defined via a photoresist shape, which in turn had been formed via exposure of a positive photoresist layer, using the same photolithographic mask previously used for definition of the implanted ESD region. In this invention we use only one photolithographic mask in the CMOS process to fabricate an ESD device having ESD implanted and metal silicide blocking regions, which can sustain higher ESD stress.

21 Claims, 17 Drawing Sheets

METHOD OF FABRICATING ESD PROTECTION DEVICE BY USING THE SAME PHOTOLITHOGRAPHIC MASK FOR BOTH THE ESD IMPLANTATION AND THE SILICIDE BLOCKING REGIONS

BACKGROUND OF THE INVENTION (1) Field of the Invention

The present invention relates to methods used to fabricate semiconductor devices, and more specifically to a method used to realize electrostatic discharge, (ESD), implantation and metal silicide blocking with the same photolithographic mask, in a CMOS process.

(2) Description of Prior Art

As the features of CMOS devices continue to be scaled down to deep-sub-micron, (less than 0.25 um), reliability concerns, in terms of ESD damage, become paramount. The input and output pins, of integrated circuit devices, such as CMOS devices, have to sustain ESD stress arising from human handling of these devices, which can approach ESD stress levels of about 2000 volts. Therefore ESD protection devices have to be fabricated, simultaneously with the CMOS devices, and placed around the input and output pads of the integrated circuit.

The concept of simultaneously forming an ESD protection device, and CMOS devices, used for either logic or memory applications, is however handicapped by several features needed with the CMOS devices which however can result in difficulties when included in the ESD protection device. For example the lightly doped, source/drain, (LDD), region, used to alleviate hot carrier effects for the CMOS devices, if used in the ESD device can allow undesirable current to be discharged through the LDD peak, resulting in a damaged ESD protection device. In addition the use of metal silicide formation, used to lower performance degrading resistances of CMOS gate, and source/drain regions, can adversely influence the effectiveness of the ESD protection device. This is a result of the drain of the device, covered with metal silicide, being close to the channel region, easily injecting unwanted ESD current into the diffusion/LDD junction.

FIGS. 1–4, schematically describe prior art, or a process sequence in which an ESD implantation region, is simultaneously formed during a CMOS fabrication sequence, however using two specific photolithographic masks for: the creation of an ESD implantation region; and for the subsequent definition of a silicide layer. Briefly, FIG. 1, schematically shows a first portion of P type semiconductor substrate 103, to be used for ESD device region 101, and a second portion to be used for CMOS device 102. P well region 104, field oxide, (FOX), region 105, as well as gate structures 107, on gate insulator layer 106, are also schematically shown in prior art, FIG. 1. After formation of LDD region 108, in CMOS region 102, photoresist shape 109, is formed, using a specific photolithographic mask for subsequent definition of an ESD implantation region. FIG. 2, schematically shows the creation of heavily doped, N type, ESD implantation region 110, formed in areas of ESD device region 101, not protected by photoresist shape 109. After formation of insulator spacers 111, on the sides of gate structures 107, and the formation of heavily doped source/drain regions 112, in CMOS device region 102, P type, substrate contact regions 118, are formed. This prior art is schematically shown in FIG. 3. A low temperature oxide, LTO), layer 113, is then deposited, followed by formation of photoresist shape 114, to be used to define openings 115, in LTO layer 113. Photoresist shape 114, which will allow metal silicide to be selectively formed on exposed regions of silicon, is defined using another specific photolithographic mask, different from the photolithographic mask used previously to define photoresist shape 109, used for definition of the ESD) implantation region. Therefore metal silicide regions 116, shown schematically in FIG. 4, were formed in openings defined using an additional photolithographic mask, when compared to the present invention in which the same photolithographic mask will be employed for the both the definition of an ESD implantation region, and for definition of openings in an LTO layer which in turn allows selective formation of metal silicide regions.

This invention will describe a novel process for simultaneously forming a ESD protection device, with CMOS devices, however alleviating and eliminating the deleterious effects of the ESD current discharged at an LDD peak, and forming a region with lower breakdown voltage under the center of the drain diffusion to discharge the ESD current. Prior art, such as Hsu, in U.S. Pat. No. 5,585,299, as well as Hsu, in U.S. Pat. No. 5,455,444, describe methods of simultaneously fabricating ESD and CMOS devices, however these prior arts need two photolithographic masks to realize the ESD implantation and silicide blocking.

In this invention a metal silicide blocking region is defined as a region blocked from metal silicide formation, thus a region without silicide, where a metal silicide region is defined as a region covered with metal silicide.

SUMMARY OF THE INVENTION

It is an object of this invention to fabricate an ESD protective device, simultaneously with the fabrication of other CMOS devices.

It is another object of this invention to form an ion implanted ESD region, for the ESD NMOS protective device, comprised with a lightly doped concentration, and at a depth great enough to contain a subsequent, more highly doped drain region.

It is yet another object of this invention to use a photolithographic mask to form an implanted ESD region, in portions of a drain region located at the periphery of gate structures, completely consuming the portion of LDD region located at the periphery of these gate structures, and with the photolithographic mask protecting a center portion of the drain/source region, from the ESD implantation procedure.

It is still yet another object of this invention to use the same photolithographic mask, previously used for definition of the implanted ESD region, to define a metal silicide shape, directly overlying the portion of the LDD region located between implanted ESD regions.

In accordance with the present invention a method used to realize ESD implantation, and silicide blocking regions, using the same photolithographic mask, in a CMOS process, is described. After formation of gate structures, LDD regions are formed in regions of a semiconductor substrate not covered by the gate structures. A photolithographic mask is used to allow an implanted ESD region to be formed in regions of the semiconductor substrate, at the periphery of the gate structures, with the photolithographic mask protecting a center portion of the LDD region from the ESD implantation procedure. After formation of insulator spacers, on the sides of the gate structures, a heavily doped region, shallower than the implanted ESD region, is formed in a region of the semiconductor substrate not covered by the gate structures, or by the insulator spacers. The same photolithographic mask, previously used to define the implanted ESD region is again used to define openings in a silicon oxide layer, exposing the top surface of the gate structures, and exposing the region of the LDD region, located between gate structures, where the LDD region was protected from the ESD implantation procedure. Metal silicide shapes are selectively formed on these exposed regions, including formation of a metal silicide shape directly overlying the portion of the LDD region, not occupied with the implanted ESD region, and leaving the drain regions, at the periphery of-the gate structures without metal silicide. Metal contact structures are then formed on elements of the ESD protective device, including formation of metal contact structures, to the metal silicide shape, located on an LDD region, between gate structures.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating an ESD protective NMOS device, simultaneously with the fabrication of CMOS logic and memory devices, featuring the same photolithographic mask for the formation of an implanted ESD region, and for the definition of a metal silicide blocking shape, located overlying a portion of the drain region, not occupied by the implanted ESD region will now be described in detail.

Figure 1:
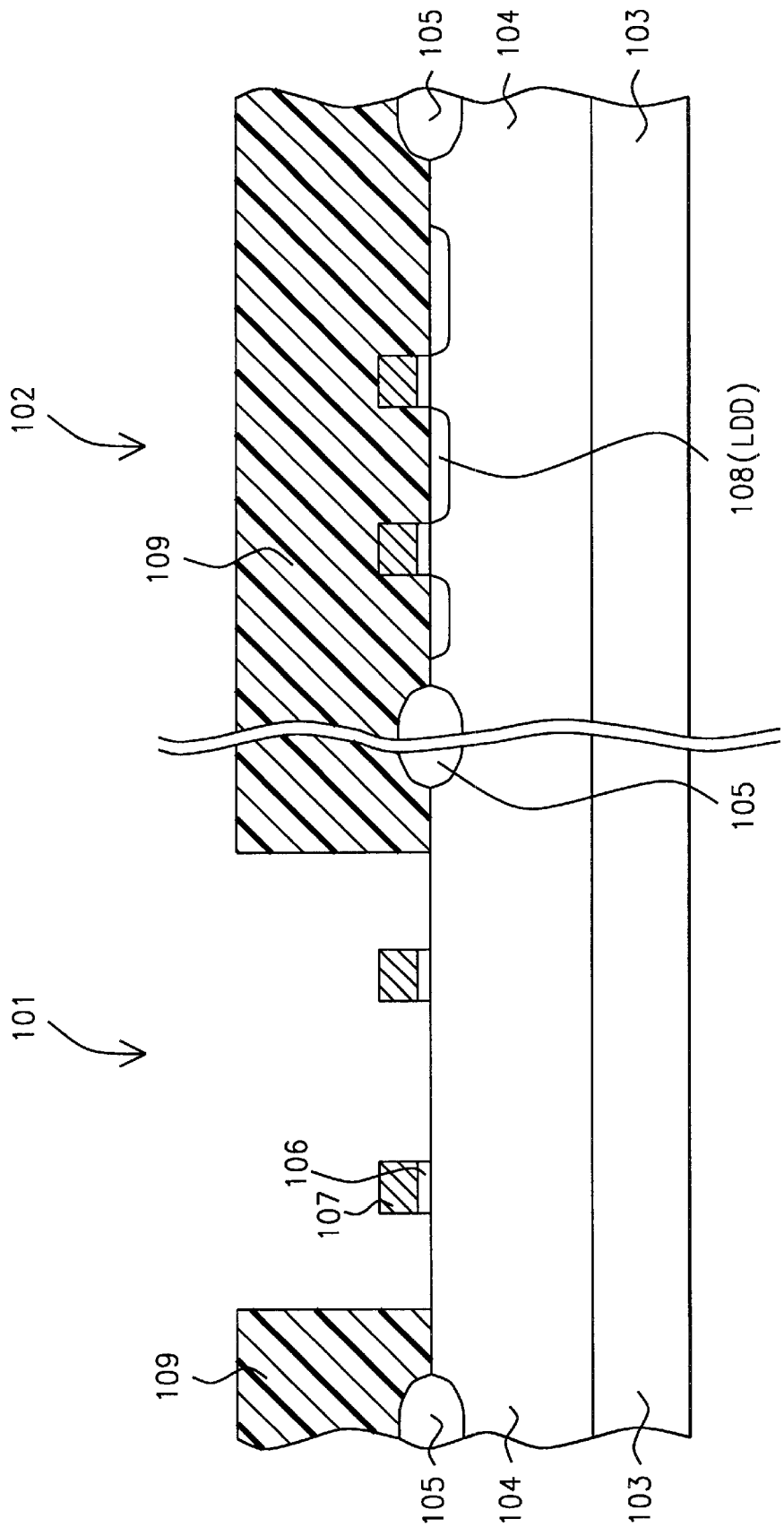
FIGS. 1–4, which schematically describe prior art, in which one specific mask is used for definition of an implanted ESD region, and another specific mask is used to define the openings in an insulator layer, exposing regions to be salicided.
Figure 2:
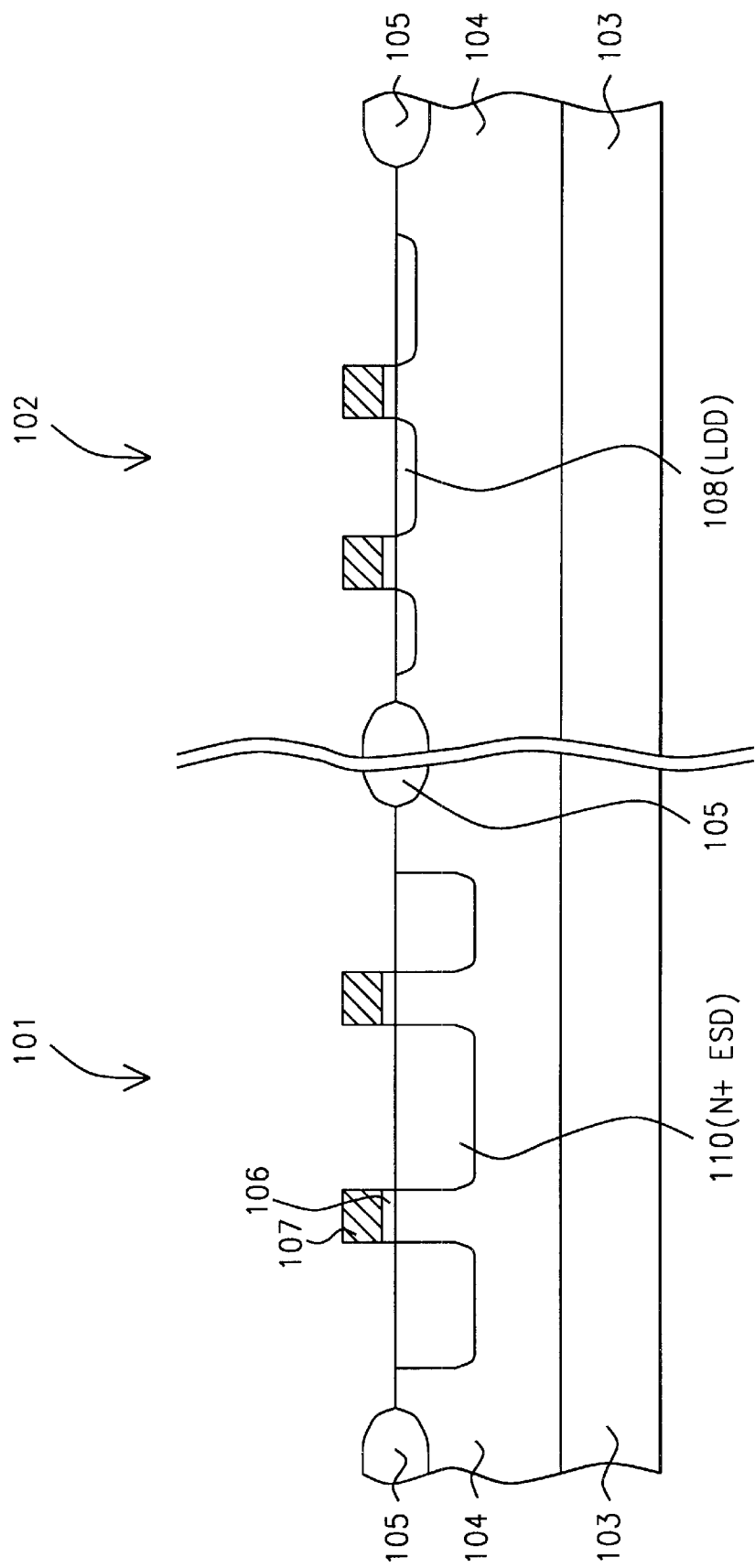
Figure 3:
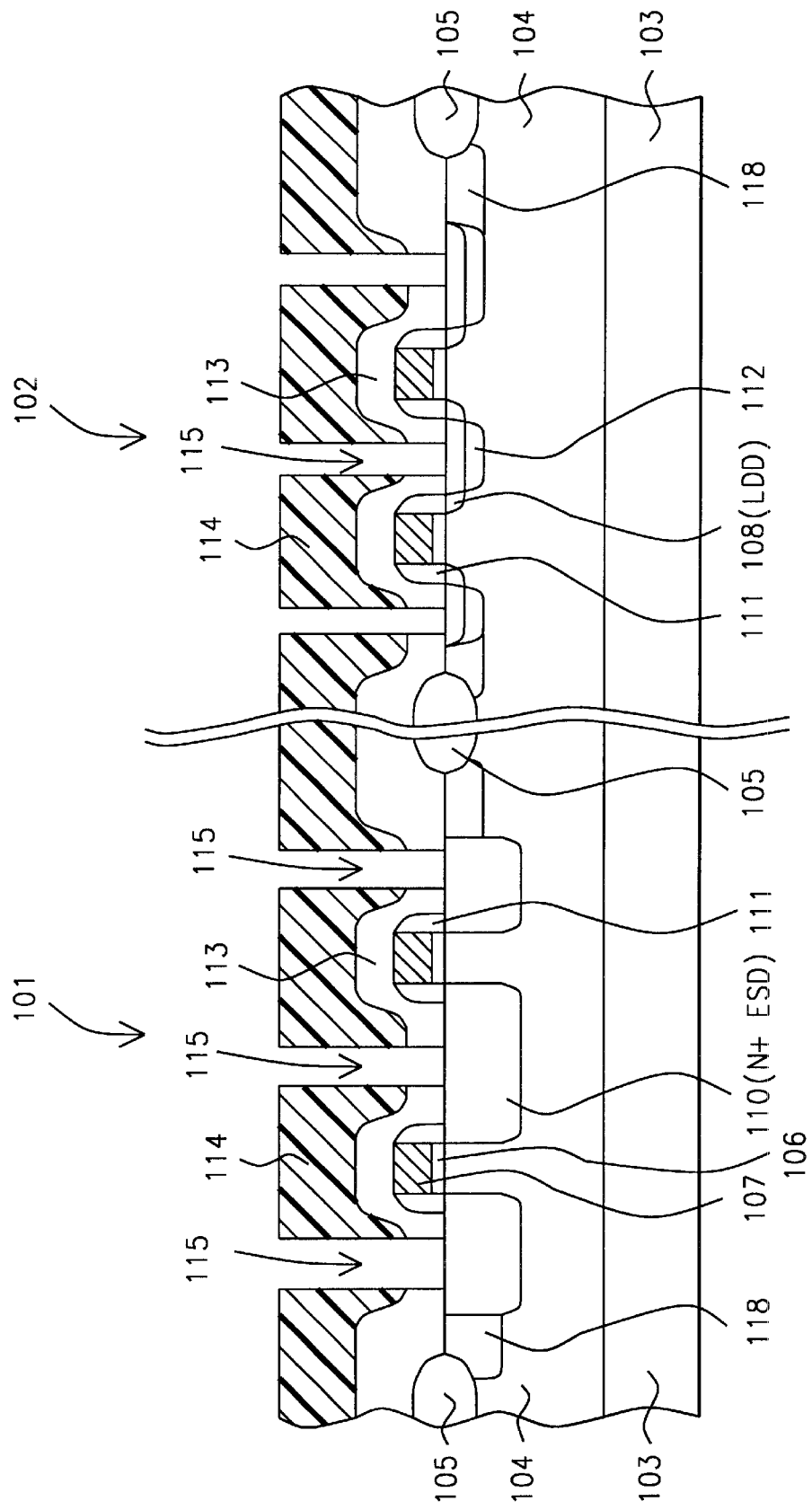
Figure 4:
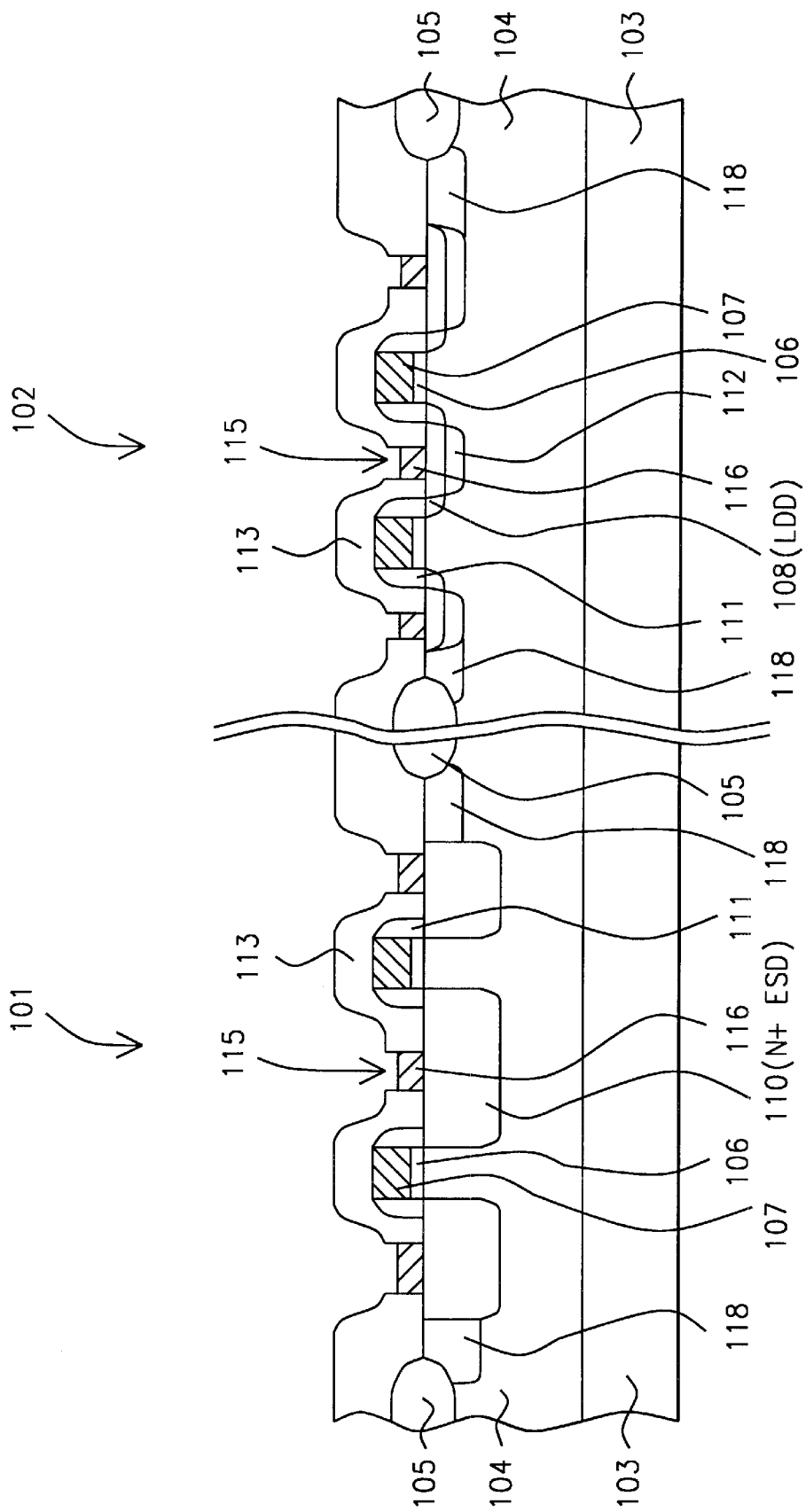
Figure 5:
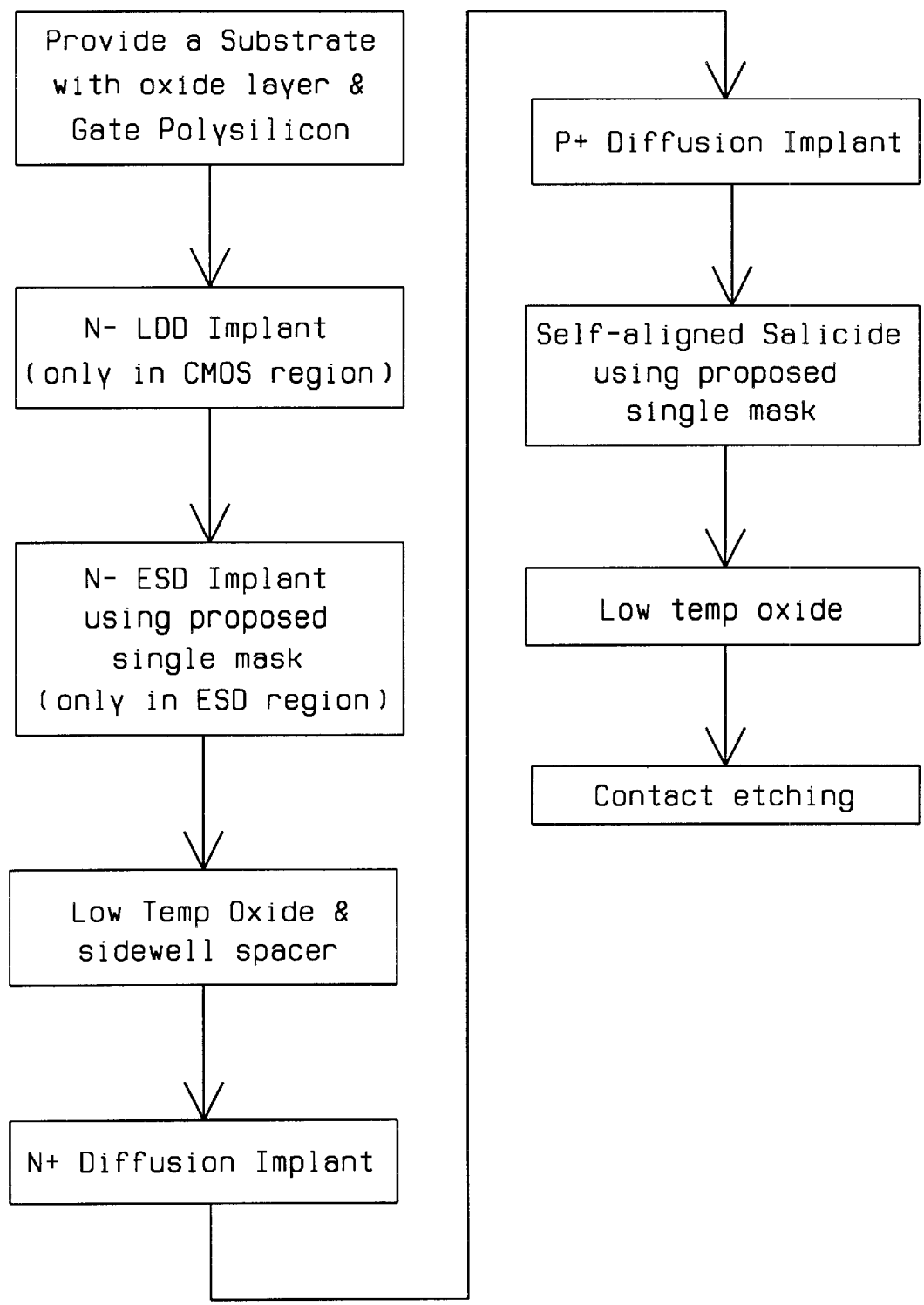
FIG. 5, which shows a summary of the process flow described in this invention in which the same photolithographic mask is used for definition of the implanted ESD region, and for definition of the metal silicide blocking regions.
Figure 6:
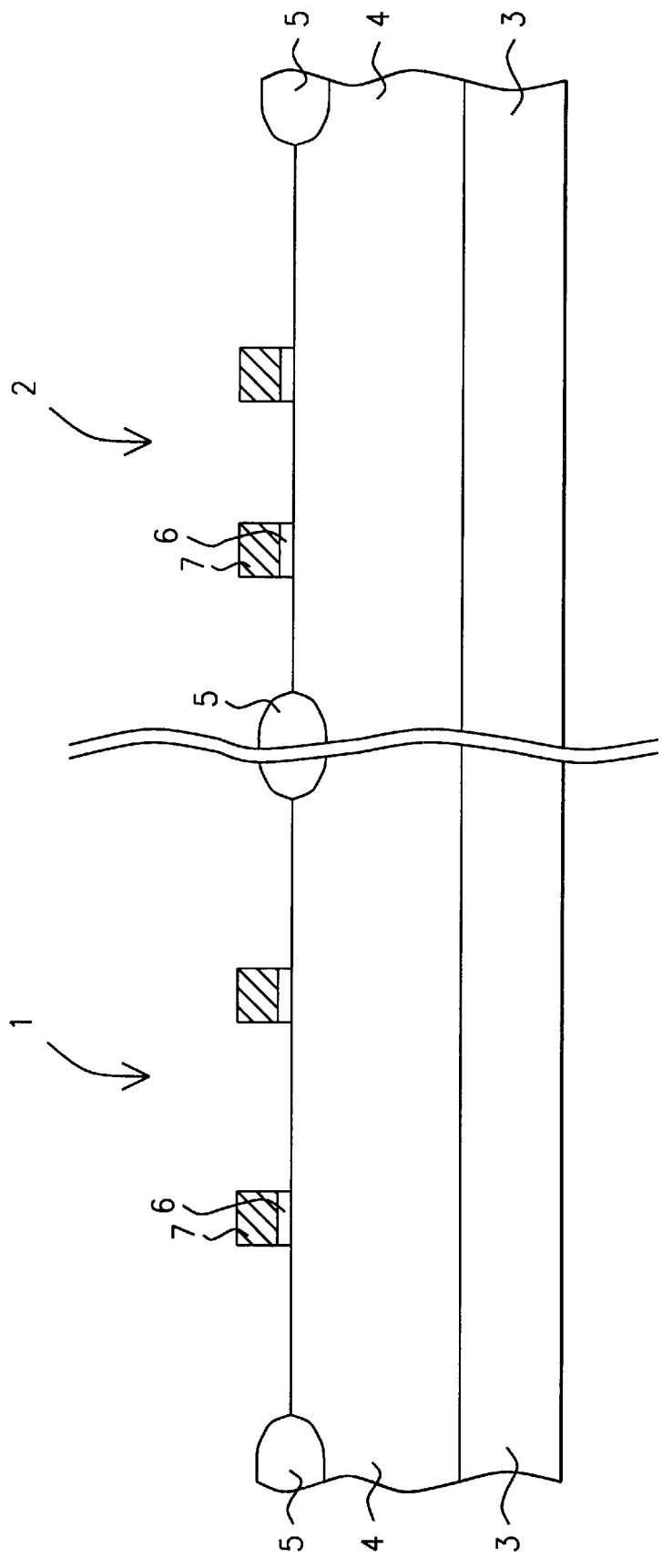
FIGS. 6–15, and 16B, which schematically, in cross-sectional style, describe key stages of fabrication used to form a NMOS protective, ESD device, featuring the use of the same photolithographic mask for formation of an implanted ESD region, and for formation of a metal silicide shape, overlying a portion of a drain region, not occupied by the implanted ESD region.

A P type, semiconductor substrate 3, comprised of single crystalline silicon, comprised with a <100> crystallographic orientation is used and schematically shown in FIG. 6. Region 1, of the semiconductor substrate will be used to accommodate the ESD protective NMOS device, while region 2, of semiconductor substrate 1, will be used for fabrication of CMOS, or NMOS devices, used for memory or logic applications, and needing the protection offered by the ESD protective device. P well region 4, is formed in a top portion of semiconductor substrate 3, offering the needed P type doping, for the subsequent NMOS devices. P well region 4, is defined via conventional photolithographic block-out, and ion implantation procedures, using boron or $BF_2$ ions. After removal of the photoresist shape, used to define P well region 4, via plasma oxygen ashing, and careful wet cleans, field oxide, (FOX), isolation regions 5, are formed. FOX regions 5, are formed via thermal oxidation of regions of semiconductor substrate 3, not protected by an oxidation resistant masking pattern, such as silicon nitride. After formation of FOX regions 5, schematically shown in FIG. 6, the oxidation resistant masking pattern is selectively removed. If desired insulator filled, shallow trench regions, can be used in place of FOX regions 5, for isolation purposes.

A gate insulator 6, comprised of silicon dioxide, is next thermally grown, in an oxygen-steam ambient, to a thickness between about 25 to 80 Angstroms. A polysilicon layer is then deposited, via low pressure chemical vapor deposition, (LPCVD), procedures, to a thickness between about 800 to 4000 Angstroms. The polysilicon layer can either be doped in situ, during deposition, via the addition of arsine, or phosphine, to a silane ambient, or the polysilicon layer can be deposited intrinsically then doped via implantation of arsenic or phosphorous ions. Conventional photolithographic and reactive ion etching, (RIE), procedures, using $Cl_2$ as an etchant for polysilicon, are employed to define the gate structures, shown schematically in FIG. 6, in both ESD region 1, and in CMOS region 2.

Figure 7:
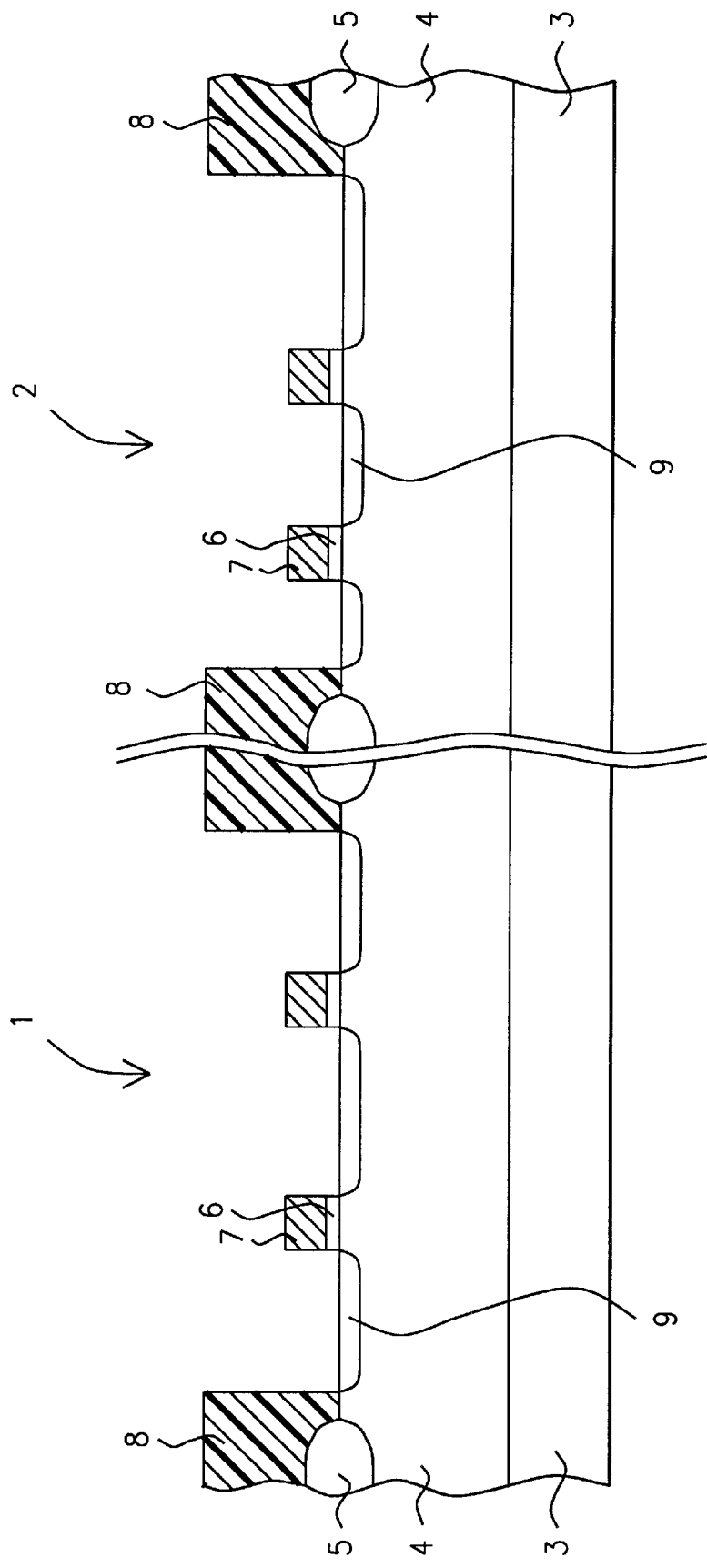

Photoresist shape 8, is next formed and used as a mask to allow, N type, lightly doped source/drain, (LDD), region 9, to be formed in regions of semiconductor substrate 3, not covered by the gate structures. LDD regions 9, shown schematically in FIG. 7, are formed via implantation of arsenic, or phosphorous ions, at an,energy between about 20 to 40 KeV, at a dose between about 5E12 to 5E13 atoms/$cm^2$. Photoresist shape 8, is then removed via plasma oxygen ashing and careful wet cleans.

Figure 8:
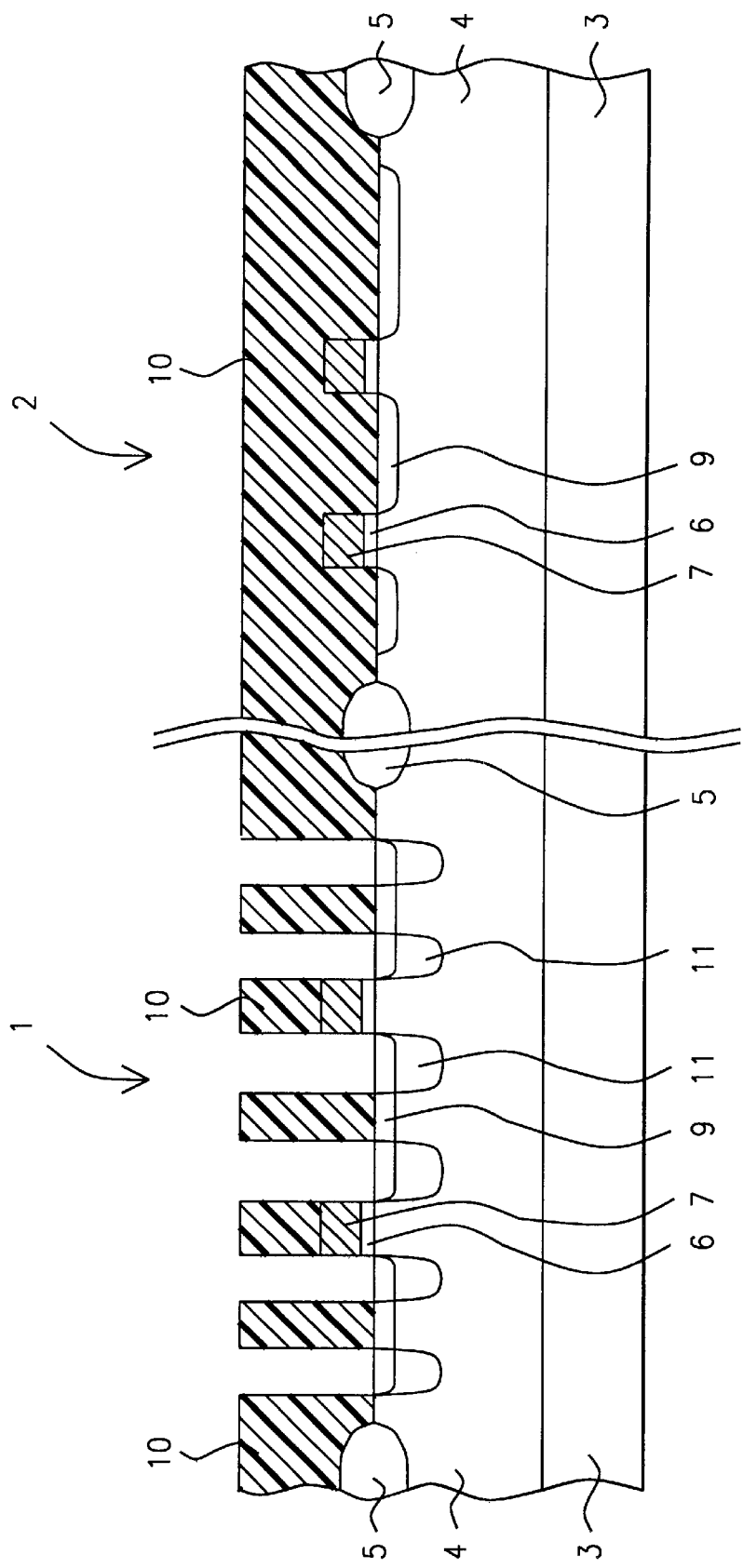

Photoresist shape 10, is next formed allowing implanted ESD region 11, to be implanted in portions of LDD region 9, exposed in openings in photoresist shape 10. Implanted ESD regions 11, formed via implantation of arsenic, or phosphorous ions, at a dose between about 1E13 to 7E13 atoms/$cm^2$, are implanted at an energy between about 60 to 100 KeV, allowing implanted ESD region 11, to be consume the exposed regions of LDD region 9. The photolithographic mask used for definition of photoresist shape 10, allows the implanted ESD region to be formed only at the periphery of the gate structure, leaving a portion of LDD region 9, between the gate structures, protected from the implantation procedure, and thus not occupied by implanted ESD regions. In addition photoresist shape 10, was formed from a negative photoresist layer, meaning that the portions of the negative photoresist layer, exposed in the clear portions of the photolithographic plate, will remain after development. The same photolithographic plate will subsequently be used again, for exposure of an underlying positive photoresist layer, to allow a metal silicide shape to be defined overlying a region now protected by the photoresist shape 10. The deep, lightly doped, implanted ESD regions, deeper than subsequent heavily doped source/drain regions, will result in high breakdown voltages. The result of these procedures are schematically shown in FIG. 8. Photoresist shape 10, is removed again via plasma oxygen ashing and careful wet cleans.

Figure 9:
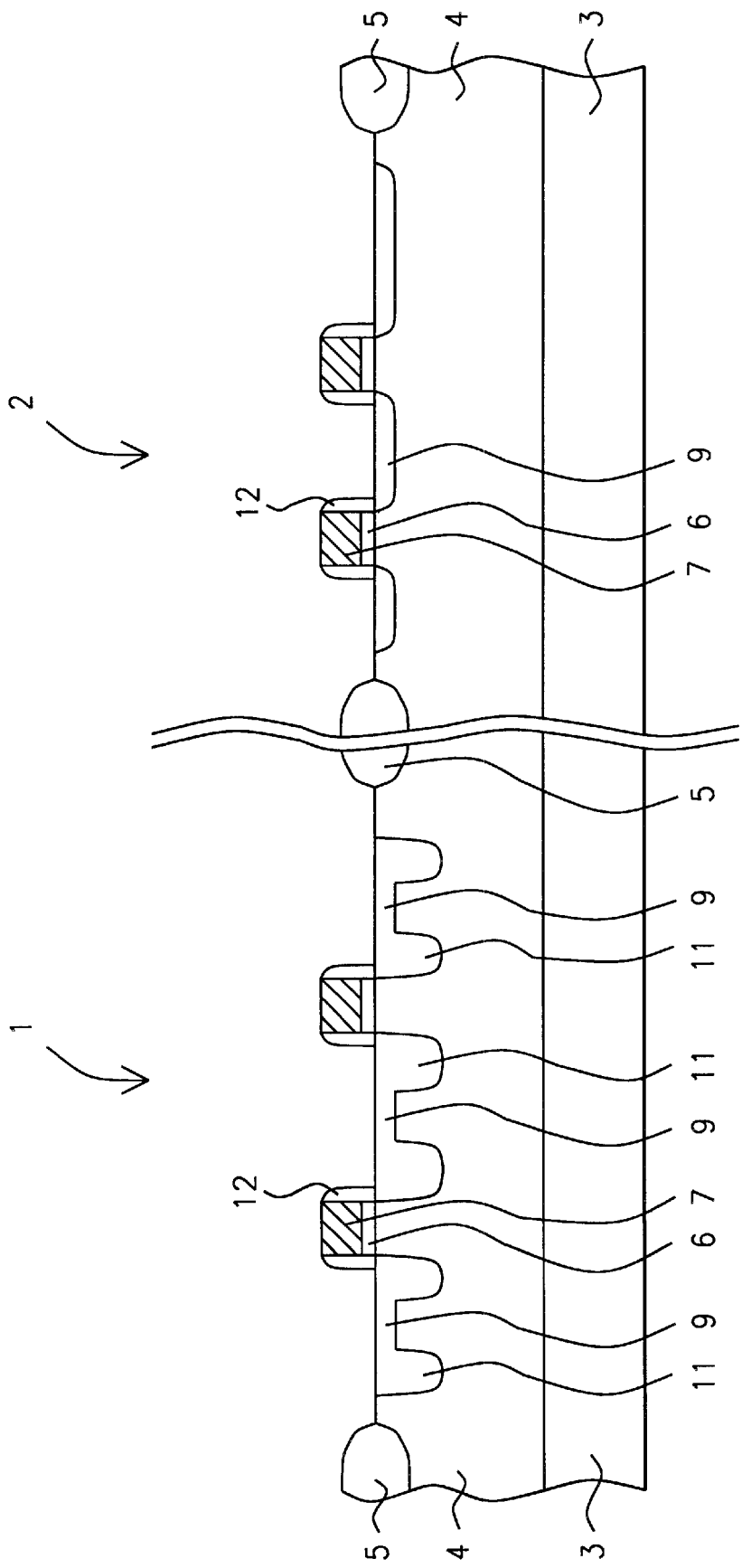
Figure 10:
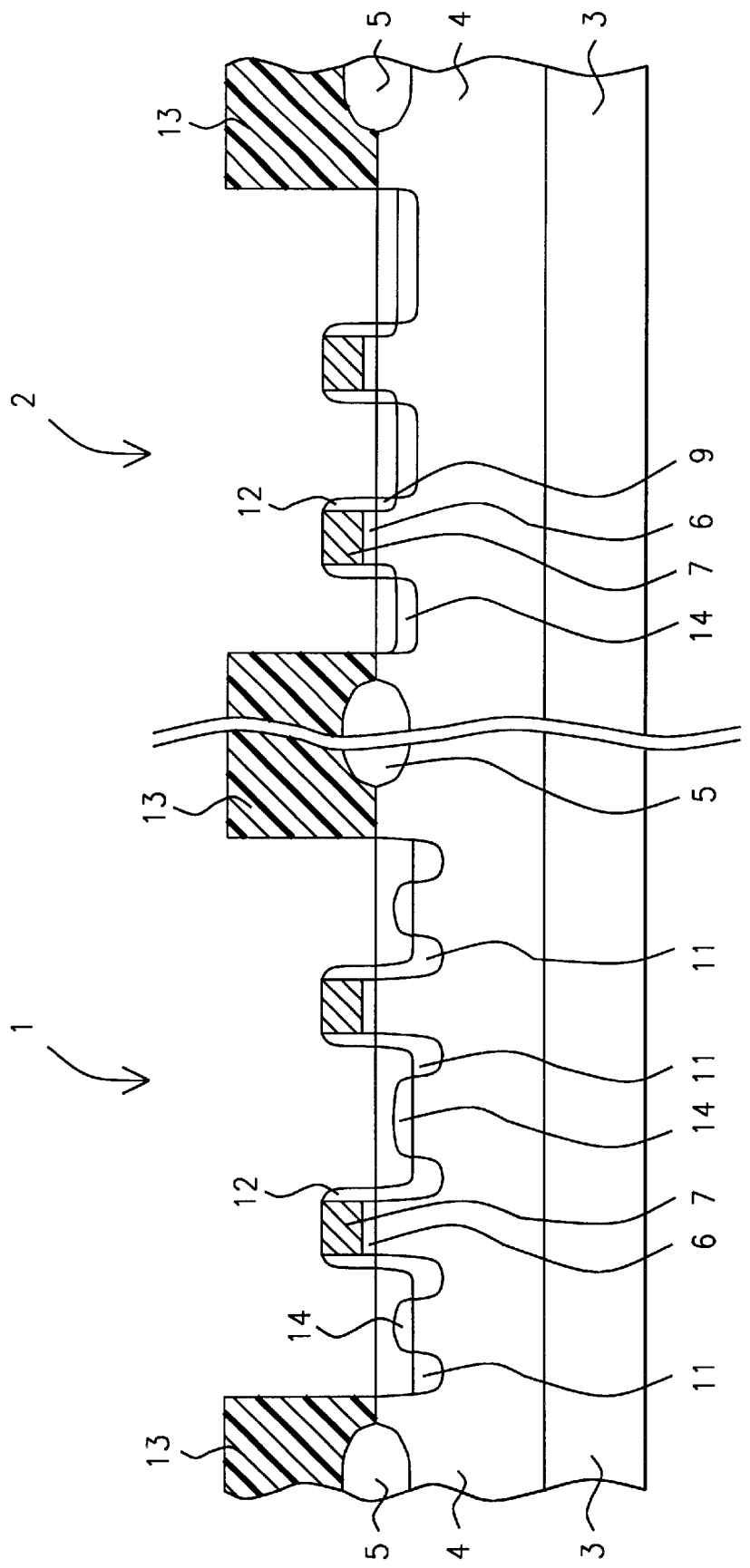

Insulator spacers 12, schematically shown in FIG. 9, are next formed on the sides of the gate structures. This is accomplished via deposition of a silicon oxide, or of a silicon nitride layer, via LPCVD or via plasma enhanced chemical vapor deposition, (PECVD), procedures, at a thickness between about 1000 to 3000 Angstroms, followed by an anisotropic RIE procedure, employing $CHF_3$ or $CF_4$ as an etchant. Photoresist shape 13, is then formed and used as a block-out mask, allowing heavily doped, N type, source/drain regions 14, to be formed in regions of semiconductor substrate 3, not covered by the gate structures, or by insulator spacers 12. This is schematically shown in FIG. 10. Heavily doped, N type, source/drain regions 14, formed in implanted ESD region 1, consume the remaining LDD region 9, which was located between implanted ESD regions 11, while heavily doped, N type source/drain region 14, formed in CMOS region 1, still allows the segment of LDD region 9, located under insulator spacer 12, in CMOS region 2, to remain. Heavily doped, N type source/drain region 14, is obtained via implantation of arsenic or phosphorous ions, at an energy between about 40 to 80 KeV, at a dose between about 1E15 to 7E15 atoms/cm$^2$. Photoresist shape 13, is then removed via plasma oxygen ashing and careful wet cleans.

Figure 11:
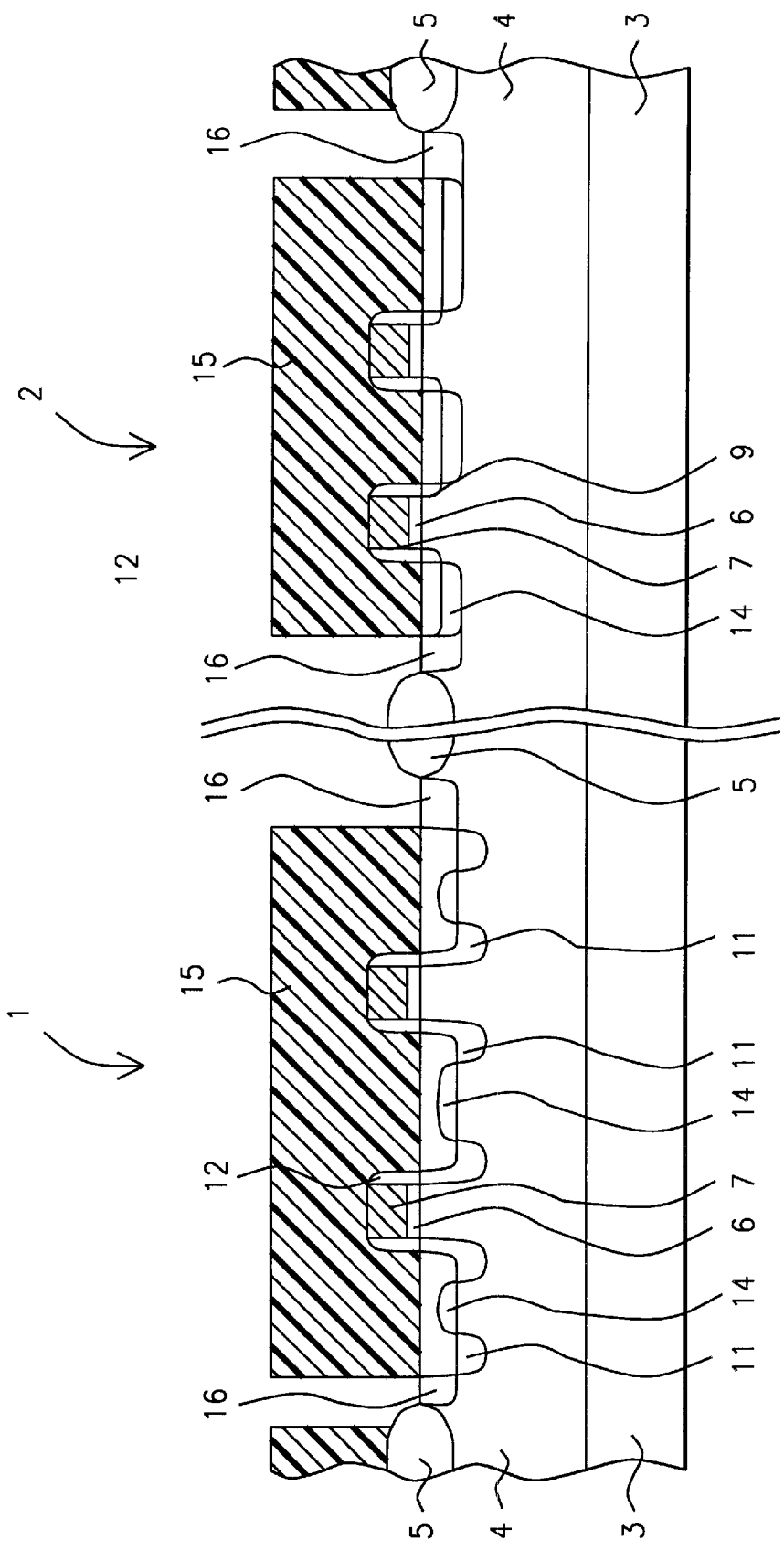

FIG. 11, schematically describes the fabrication of heavily doped P type regions 16, in both implanted ESD region 1, and in CMOS region 2. Heavily doped P type regions 16, are used for substrate contact purposes. These regions are formed via ion implantation of regions not covered by photoresist block-out shape 15, using boron or $BF_2$ ions, at an energy between about 40 to 80 KeV, at a dose between about 1E15 to 7E15 atoms/cm$^2$. Photoresist block-out shape 15, is then removed, again via plasma oxygen ashing and careful wet cleans.

Figure 12:
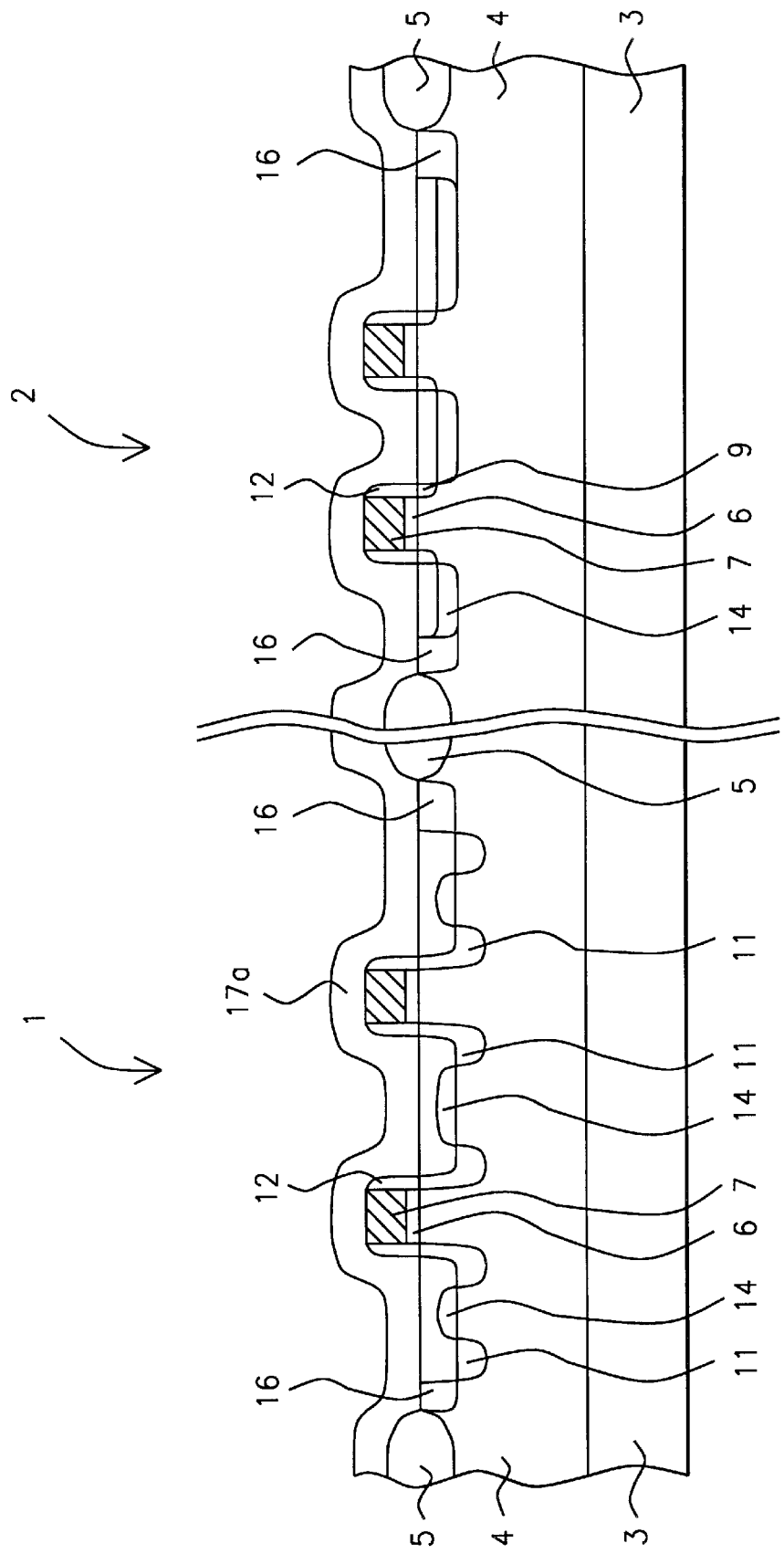
Figure 13:
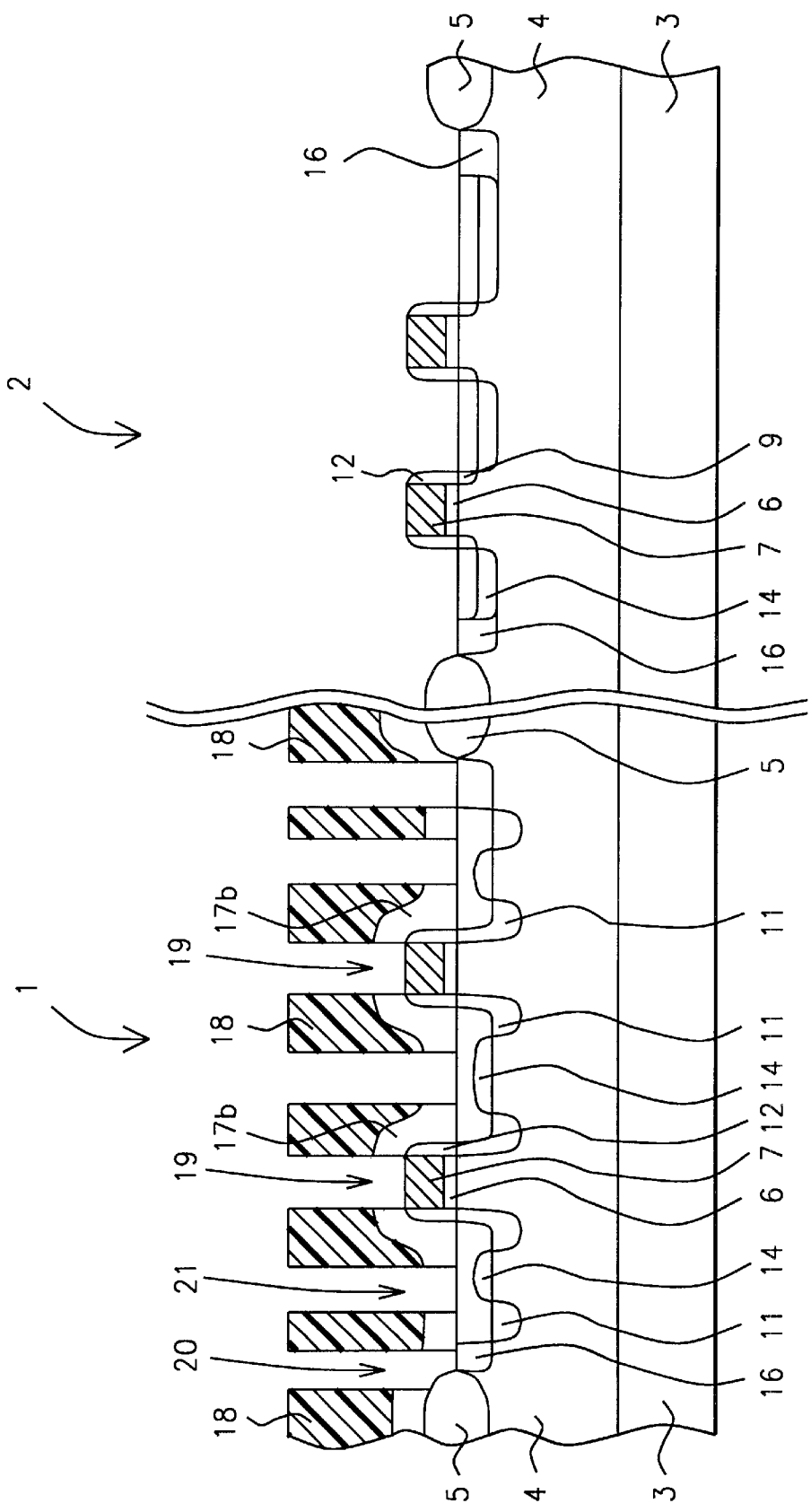
Figure 14:
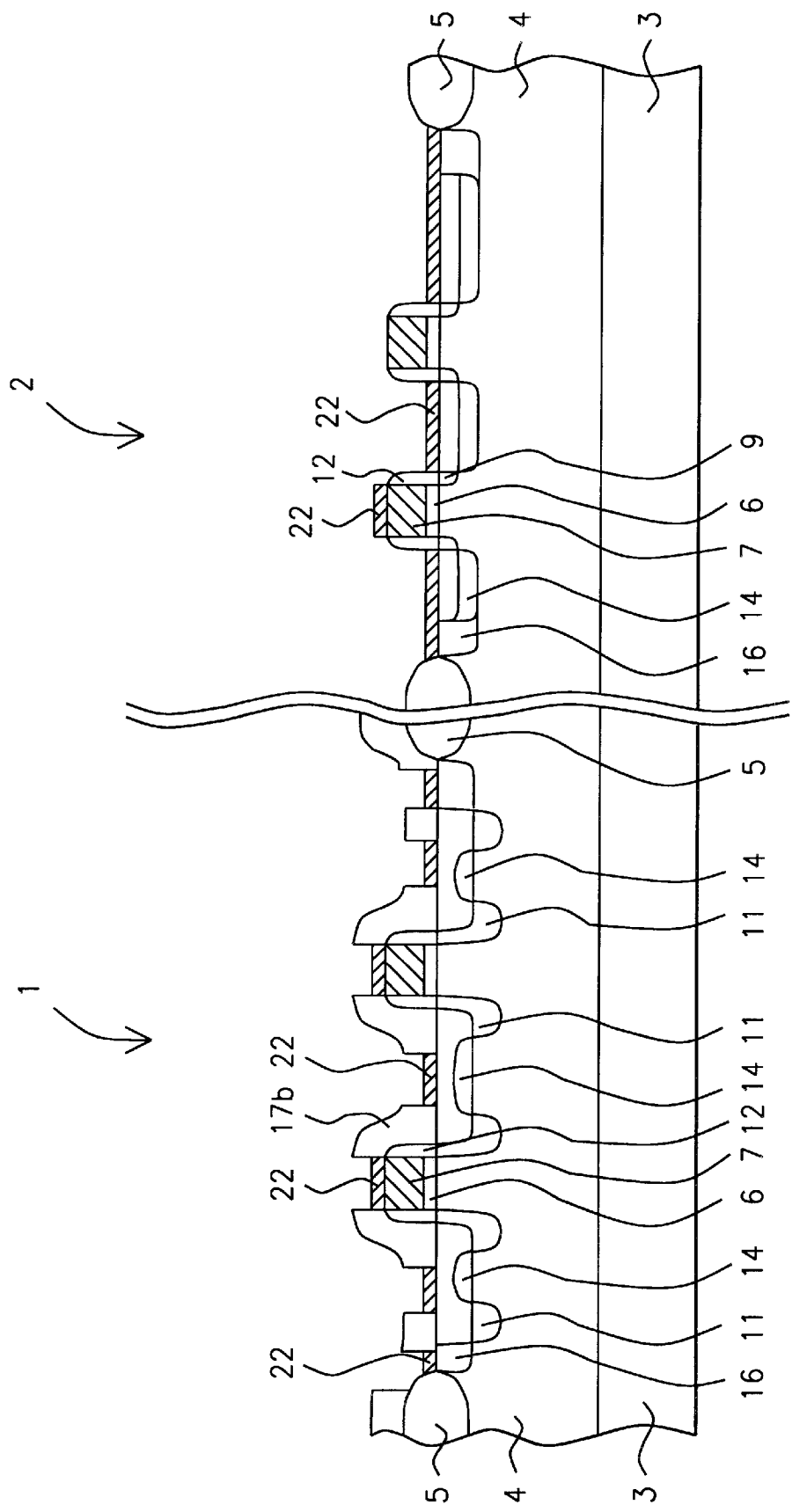

The formation of metal silicide shapes, or self-aligned metal silicide, (salicide), formation, on specific regions in implanted ESD region 1, and in CMOS region 2, is next addressed and schematically described using FIGS. 12–14. A low temperature silicon oxide, LTO), layer 17a, shown schematically in FIG. 12, is deposited via LPCVD or PECVD procedures, at a thickness between about 1000 to 5000 Angstroms. A positive photoresist layer is then applied and subjected to a photolithographic exposure procedure, using the identical photolithographic plate previously used to define implanted ESD region 11. However due to the use of the positive photoresist, regions subjected to the photolithographic exposure procedure, through clear regions in the photolithographic plate, are developed, resulting in photoresist shape 18, which results in exposure of portions of LTO layer 17a, which in turn overlay regions in implanted ESD region 1, that were previously protected from the ESD implantation process, via photoresist shape 10, obtained from photolithographic exposure of a negative photoresist layer. Regions of LTO layer 17a, exposed in openings in photoresist shape 18, are then removed via a wet etch, such as a buffered hydrofluoric, (BHF), acid solution, or a dilute hydrofluoric, (DHF), solution, creating openings 19, in implanted ESD region 1, with openings 19, now exposing portions of implanted ESD region 1, for subsequent salicide formation. LTO layer 17a, is completely removed in CMOS region 2, allowing subsequent salicide formation to be accomplished on all exposed silicon, and on all exposed polysilicon surfaces, while LTO shapes 17b, to be used to protect specific regions of implanted ESD region 1, from subsequent salicide processing, are located in implanted ESD region 1. This is schematically shown in FIG. 13. Openings 19, can also be defined via RIE procedures, using $CHF_3$ as an etchant for LTO layer 17a.

After removal of photoresist shape 18, via plasma oxygen ashing and careful wet cleans, a metal layer, such as titanium or cobalt, is deposited, via plasma vapor deposition, (PVD), procedures, to a thickness between about 1500 to 3000 Angstroms. An anneal procedure, performed either using a rapid thermal anneal, (RTA), procedure, at a temperature between about 600 to 900° C., is employed to form metal silicide shapes 22, such as titanium silicide or cobalt silicide, on regions of silicon or polysilicon, while portions of metal, overlying portions of LTO shapes 17b, FOX regions 5, and insulator spacers 12, unreacted. The unreacted metal is then removed using a 5:1:1 solution comprised of de-ionized, (DI), $H_2O$—$H_2O_2$—$NHOH_4$, resulting in the desired self-aligned, metal silicide shapes 22, in both implanted ESD region 1, and in CMOS region 2. This is schematically shown in FIG. 14. If desired a second rapid thermal processing, (RTP), procedure can be used to further reduce the resistance of metal silicide shapes 22, also if desired the above anneals can be performed in a conventional importance. Of importance is metal silicide shape 22, overlying the region between implanted ESD regions 11, in implanted ESD region 1. The distance between metal silicide shape 22, and the gate structure of the NMOS ESD protective device, allows the ESD current to be discharged.

Figure 15:
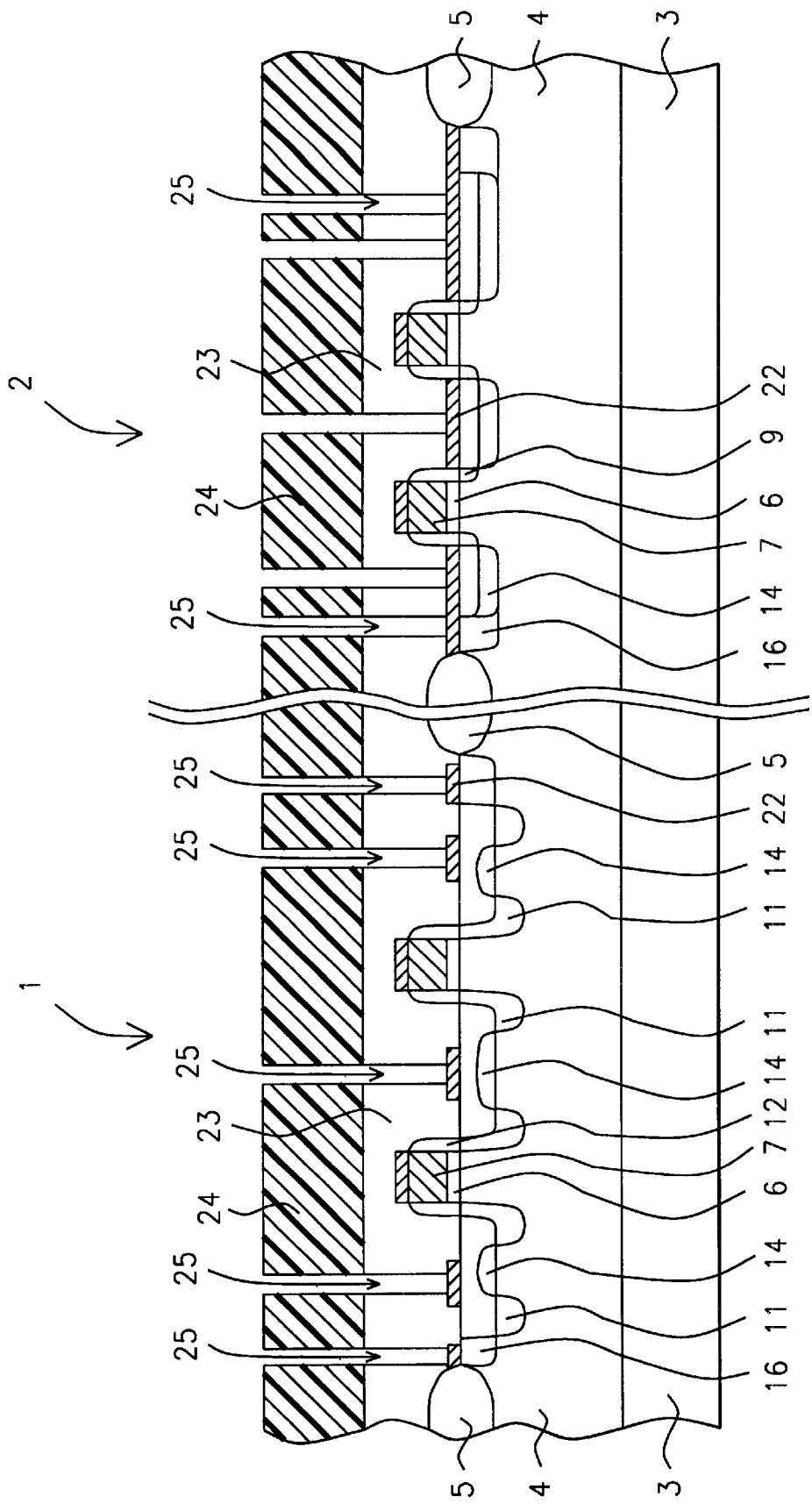
Figure 16A:
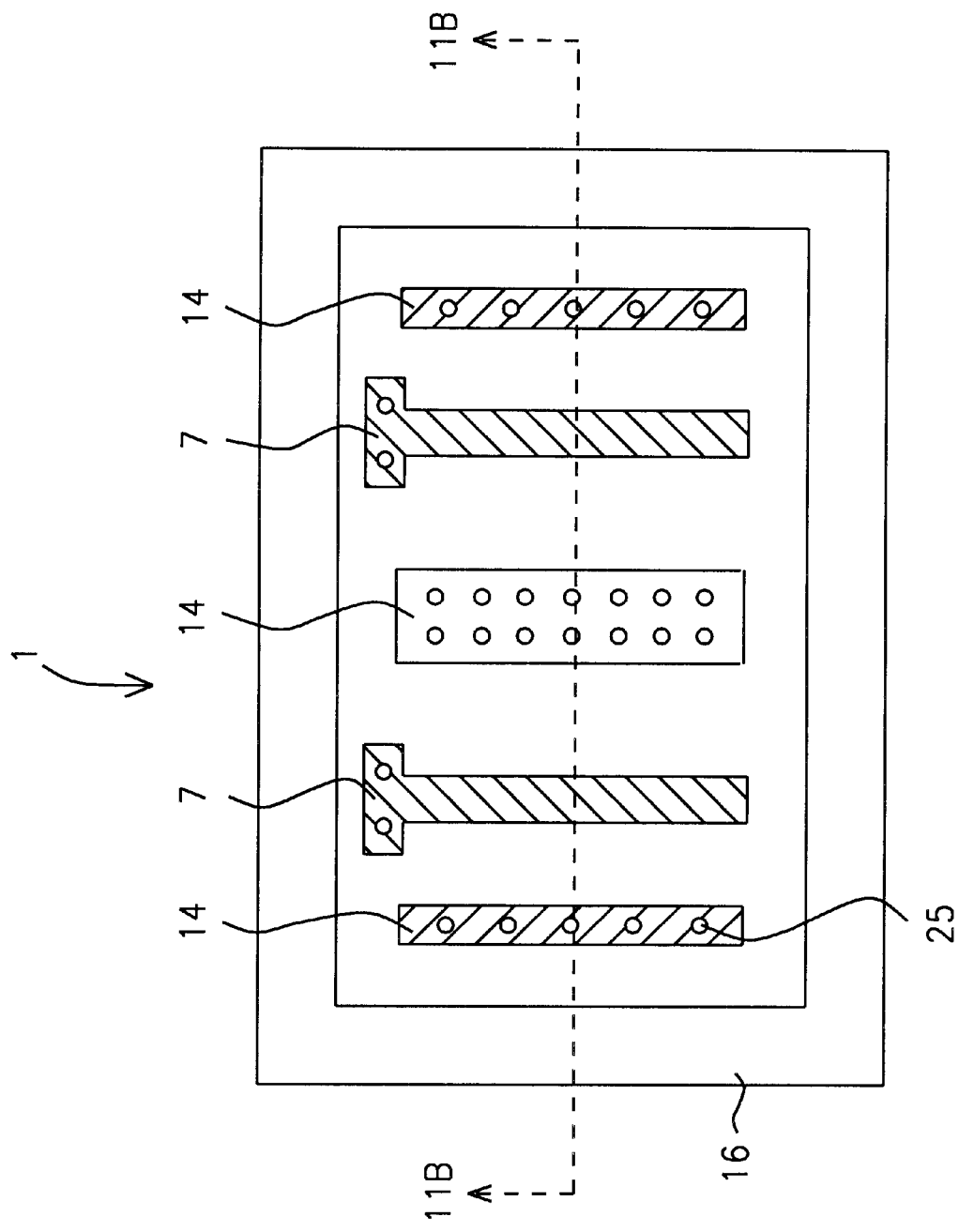
FIG. 16A, which schematically shows a top view of the completed NMOS protective, ESD device.
Figure 16B:
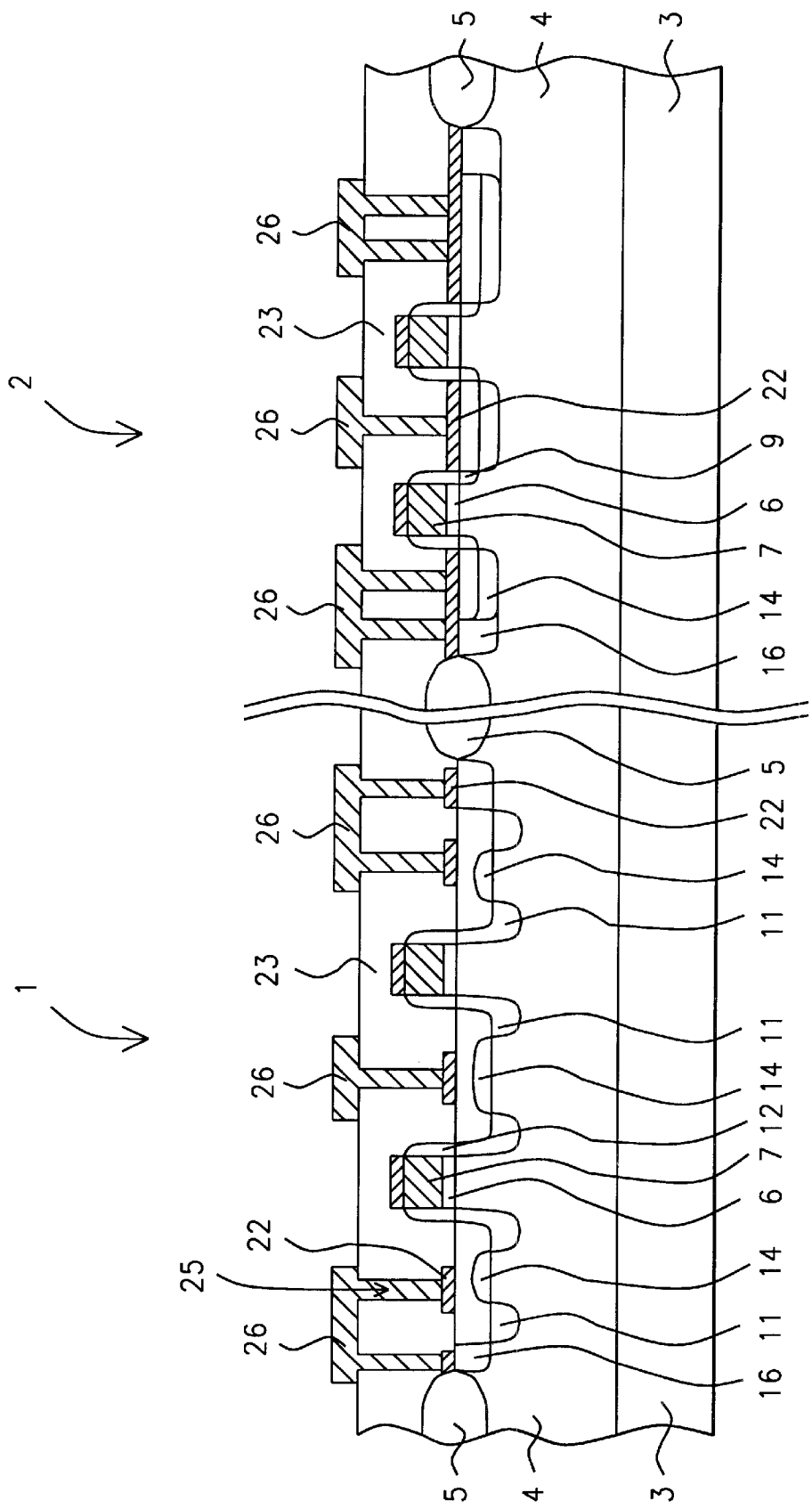

Removal of LTO shapes 17b, is next accomplished, again via a BHF or DHF solution, followed by the deposition of a borophosphosilicate glass, (BPSG), layer, 23, via PECVD procedures, to a thickness between about 3000 to 8000 Angstroms. A chemical mechanical polishing, (CMP), procedure is then employed for planarization purposes, resulting in a smooth top surface topography for BPSG layer. Photoresist shape 24, is formed and used as a mask to allow openings 25, to be defined in BPSG layer 23, via anisotropic RIE procedures, using CHF3 as an etchant. Openings 25, expose portions of the top surface of metal silicide shapes 22, in regions in which metal silicide shapes 22, were formed on heavily doped, N type source/drain regions, heavily doped P type regions, and on polysilicon gate structures, (not shown in the drawings), in both implanted ESD region 1, and in CMOS region 2. This is schematically shown in FIG. 15. After removal of photoresist shape 24, via plasma oxygen ashing and careful wet cleans, a metal layer, such as an aluminum layer, an aluminum based layer containing copper and silicon, or a tungsten layer, is deposited via PVD procedures, at a thickness between about 1500 to 5000 Angstroms, completely filling openings 25. Conventional photolithographic and RIE procedures, using $Cl_2$ or $SF_6$ as an etchant for the metal layer, are used to define metal contact and interconnect structures 26, overlying and contacting metal silicide shapes 22, in both implanted ESD region 1, and in CMOS region 2. This is schematically shown in cross-sectional style in FIG. 16B, and as a top view in FIG. 16A. The photoresist shape used to define metal contact and interconnect structures 26, is then removed via plasma oxygen ashing and careful wet cleans.

While this invention has been particularly shown and described with reference to, the preferred embodiments thereof, it will be understood by those skilled in the art that various changes in form and details may be made without departing from the spirit and scope of this invention.

What is claimed is:
1. A method of using a single photolithographic mask to define an implanted, electrostatic discharge, (ESD), region, and metal silicide blocking regions, and to self-align a metal silicide shape to an implanted ESD region, on a semiconductor substrate, comprising the steps of:

forming gate structures, on a gate insulator layer, on said semiconductor substrate;

forming a lightly doped source/drain, (LDD), region, in an area of said semiconductor substrate, located between said gate structures;

using said photolithographic mask to define implanted ESD regions in said semiconductor substrate, with each implanted ESD region comprised of implanted ESD sub-regions, each located at the periphery of a gate structure, with each implanted ESD sub-region deeper than said LDD region consuming a portion of underlying said LDD region, and with a center portion of said LDD region, located between said implanted ESD sub-regions, not occupied by said implanted ESD regions;

forming insulator spacers on the sides of said gate structures;

forming a heavily doped source/drain region in an area of said semiconductor substrate not covered by said gate structures or by said insulator spacers, and with first portions of said heavily doped source/drain region located in top portions of said implanted ESD sub-regions, and with a second portion of said heavily doped source/drain region located between said implanted ESD sub-regions, consuming said center portion of said LDD region;

using said photolithographic mask to define forming an opening in an insulator layer, exposing a portion of the top surface of said second portion of said heavily doped source/drain region;

forming said metal silicide shape on said portion of the top surface of said second portion of said heavily doped source/drain region exposed in said opening in said insulator layer, with said metal silicide shape self-aligned to said ESD region; and forming a metal contact and interconnect structure, on said metal silicide shape located on said second portion of said heavily doped source/drain region.

2. The method of claim 1, wherein said gate insulator layer is a silicon dioxide layer, obtained via thermal oxidation procedures, to a thickness between about 25 to 80 Angstroms.

3. The method of claim 1, wherein said gate structures, are polysilicon gate structures, obtained via deposition of an in situ doped, polysilicon layer, via LPCVD procedures, to a thickness between about 800 to 4000 Angstroms, and defined via an anisotropic RIE procedure, using $Cl_2$ as an etchant.

4. The method of claim 1, wherein said lightly doped source/drain, (LDD), region, is a N type, LDD region, obtained via implantation of arsenic, or phosphorous ions, at an energy between about 20 to 40 KeV, at a dose between about 5E12 to 5E13 atoms/$cm^2$.

5. The method of claim 1, wherein said implanted ESD region, is an N type, implanted ESD region, formed via implantation of arsenic, or phosphorous ions, at an energy between about 60 to 100 KeV, at a dose between about 1E13 to 7E13 atoms/$cm^2$.

6. The method of claim 1, wherein said implanted ESD region is defined by a photoresist masking shape, obtained via exposure of a negative photoresist layer, through clear regions of a photolithographic plate, with the same photolithographic plate also used for subsequent definition of said opening in said insulator layer.

7. The method of claim 1, wherein said heavily doped source/drain region is an N type, heavily doped source/drain region, obtained via implantation of arsenic or phosphorous ions, at an energy between about 40 to 80 KeV, at a dose between about 1E15 to 7E15 atoms/$cm^2$.

8. The method of claim 1, wherein said insulator layer, is a low temperature oxide, (LTO), layer, comprised of silicon oxide layer, obtained via LPCVD or PECVD procedures, at a thickness between about 1000 to 5000 Angstroms.

9. The method of claim 1, wherein said opening, in said insulator layer, is defined by a photoresist masking shape, obtained via exposure of a positive photoresist layer, through clear regions of the photolithographic mask that was also used for definition of said implanted ESD region.

10. The method of claim 1, wherein said opening, in said insulator layer, is formed via wet etching procedures, using a BHF or a DHF solution.

11. The method of claim 1, wherein said metal silicide shape, located on said second portion of said heavily doped source/drain region, is comprised of titanium silicide, or of cobalt silicide.

12. A method of forming an ESD, (electrostatic discharge), NMOS, (n channel metal oxide semiconductor), protective device, on a semiconductor substrate, featuring the use of an identical photolithographic plate to define both an implanted ESD region and a metal silicide shape, wherein said metal silicide shape is self-aligned to said implanted ESD region, comprising the steps of:

growing a silicon dioxide gate insulator layer;

forming polysilicon gate structures on said silicon dioxide gate insulator layer;

forming an N type, lightly doped source/drain, (LDD), region, in an area of said semiconductor substrate located between said polysilicon gate structures;

applying a negative photoresist layer;

performing a first photolithographic exposure, through clear regions in said photolithographic plate, to form a first photoresist shape, exposing first portions of said N type, LDD region, located at the periphery of said polysilicon gate structures;

forming N type, implanted ESD regions, in portions of said N type, LDD region not covered by said first photoresist shape, resulting in N type, implanted ESD sub-regions, located at the periphery of said polysilicon gate structures, consuming first portions of said N type, LDD region, while leaving a second potion of said N type, LDD region, located between said N type, implanted ESD sub-regions, underlying said first photoresist shape, unimplanted;

forming insulator spacers on the sides of said polysilicon gate structures;

forming an N type, heavily doped, source/drain region, in an area of said semiconductor substrate not covered by said gate structures or by said insulator spacers, with first portions of said N type, heavily doped source/drain region occupying a top portion of said N type, implanted ESD region, and with a second portion of said N type, heavily doped source/drain region consuming said second portion of said N type, LDD region, located between said N type, implanted ESD sub-regions;

depositing an insulator layer;

applying a positive photoresist layer;

performing a second photolithographic exposure, through clear openings in said photolithographic plate, to form a second photoresist shape, exposing a portion of said insulator layer which in turn overlays said second portion of said N type, heavily doped source/drain region;

creating an opening in said insulator layer, using said second photoresist shape as a mask, with said opening exposing a top surface of said second portion of said N type, heavily doped source/drain region, located between said N type, implanted ESD sub-regions;

forming said metal silicide shape on said second portion of said N type, heavily doped source/drain region, exposed in said opening in said insulator layer, with said metal silicide shape self-aligned to an N type, implanted ESD region; and forming a metal contact and interconnect structure, on said metal silicide shape.

13. The method of claim 12, wherein said silicon dioxide gate insulator layer is obtained via thermal oxidation procedures, in an oxygen steam ambient, to a thickness between about 25 to 80 Angstroms.

14. The method of claim 12, wherein said polysilicon gate structures are obtained via deposition of an in situ doped, polysilicon layer, using LPCVD procedures, at a thickness between about 800 to 4000 Angstroms, and defined via an anisotropic RIE procedure, using $Cl_2$ as an etchant for polysilicon.

15. The method of claim 12, wherein said N type, lightly doped source/drain, (LDD), region, is obtained via implantation of arsenic, or phosphorous ions, at an energy between about 20 to 40 KeV, at a dose between about 5E12 to 5E13 atoms/cm².

16. The method of claim 12, wherein said N type, implanted ESD region, is formed via implantation of arsenic, or phosphorous ions, at an energy between about 60 to 100 KeV, at a dose between about 1E13 to 7E13 atoms/cm².

17. The method of claim 12, wherein said insulator spacers, on the sides of said polysilicon gate structures, are comprised of silicon oxide, or silicon nitride, obtained via deposition of silicon oxide, or silicon nitride, via LPCVD or PECVD procedures, at a thickness between about 1000 to 3000 Angstroms, then defined via an anisotropic RIE procedure, using $CHF_3$ or $CF_4$ as an etchant.

18. The method of claim 12, wherein said N type, heavily doped source/drain region is obtained via implantation of arsenic or phosphorous ions, at an energy between about 40 to 80 KeV, at a dose between about 1E15 to 7E15 atoms/cm².

19. The method of claim 12, wherein said insulator layer, is a low temperature oxide, (LTO), layer, comprised of a silicon oxide layer, obtained via LPCVD or PECVD procedures, at a thickness between about 1000 to 5000 Angstroms.

20. The method of claim 12, wherein said opening, in said insulator layer is formed via wet etching procedures, using a BHF or a DHF solution, and using the second photoresist shape as an etch mask.

21. The method of claim 12, wherein said silicide shape, located on said second portion of said heavily doped source/drain region, is comprised of titanium silicide, or of cobalt silicide.

* * * * *